United States Patent
Cho et al.

(10) Patent No.: US 7,746,073 B2
(45) Date of Patent: Jun. 29, 2010

(54) MAGNETIC RESONANCE IMAGING SYSTEM

(75) Inventors: Zang Hee Cho, Incheon (KR); Young Bo Kim, Gyeonggi-do (KR); Kyoung Nam Kim, Seoul (KR); Suk Min Hong, Incheon (KR)

(73) Assignee: Gachon University of Medicine & Science Industry-Academic Cooperation Foundation, Incheon (KR)

( * ) Notice: Subject to any disclaimer, the term of this patent is extended or adjusted under 35 U.S.C. 154(b) by 43 days.

(21) Appl. No.: 12/046,209

(22) Filed: Mar. 11, 2008

(65) Prior Publication Data

US 2008/0309340 A1 Dec. 18, 2008

(30) Foreign Application Priority Data

Jun. 18, 2007 (KR) ............... 10-2007-0059619

(51) Int. Cl.
G01V 3/00 (2006.01)
(52) U.S. Cl. .................. 324/318; 324/319; 324/322
(58) Field of Classification Search ............ 324/318, 324/319, 322
See application file for complete search history.

(56) References Cited

U.S. PATENT DOCUMENTS

| | | | |
|---|---|---|---|
| 4,682,112 A | * | 7/1987 | Beer ............... 324/322 |
| 5,208,534 A | | 5/1993 | Okamoto et al. |
| 5,216,368 A | * | 6/1993 | Leussler ............ 324/318 |
| 5,635,837 A | | 6/1997 | Börnert |
| 6,097,186 A | * | 8/2000 | Nabetani ............ 324/319 |
| 6,590,392 B2 | * | 7/2003 | Boskamp et al. ........ 324/318 |

FOREIGN PATENT DOCUMENTS

JP 07-303622 11/1995

* cited by examiner

*Primary Examiner*—Louis M Arana
(74) *Attorney, Agent, or Firm*—Patterson Thuente Christensen Pederson, P.A.

(57) ABSTRACT

A magnetic resonance imaging system is provided, which can provide the homogeneous magnetic field to obtain a head anatomic image with a high resolution and high SNR by coaxially disposing a receive-only phased array antenna inside a transmit-only antenna with a predetermined gap, and thereby a detailed and accurate image of a man's head can be obtained. In the present invention, the system comprises: a transmit-only antenna comprising at least two saddle quadrature antennas connected with each other to form a ring shape, one of the connections being a joint and the remaining connections being formed in an overlapping fashion; and a receive-only phased array antenna comprising a plurality of receive-only antennas connected with each other to form a ring shape, one of the connections being a joint and the remaining connections being formed in an overlapping fashion, wherein an inner diameter of the receive-only phased array antenna is shorter than that of the transmit-only antenna, and the receive-only phased array antenna is coaxially disposed inside the transmit-only antenna with a predetermined gap.

8 Claims, 11 Drawing Sheets

FIG. 6

MAGNETIC RESONANCE IMAGING SYSTEM

The present application claims priority to Korean Patent Application No. 10-2007-0059619 entitled "MAGNETIC RESONANCE IMAGING SYSTEM" and was filed on Jun. 18, 2007. The entire contents of which are incorporated herein by reference.

BACKGROUND OF THE INVENTION

1. Field of the Invention

The present invention generally relates to a magnetic resonance imaging system comprising 12 channel phased array antennas for providing homogeneous magnetic field to thereby obtain a head anatomic image with a high resolution and high signal to noise ratio (SNR). Particularly, the present invention relates to the magnetic resonance imaging system comprising a transmit-only antenna and a multi channel phased array antenna, which are separated from each other.

2. Description of the Related Art

The magnetic resonance imaging under high magnetic field is known to provide higher SNR and contrast (due to T2 (spin-spin) relaxation) than that using a low magnetic field. For the reason, an extensive research has been conducted into the magnetic resonance imaging system that operates under a high magnetic field. One of the most important issues in such a system is that a radio frequency (RF) antenna having a high SNR, homogeneous magnetic field, and low specific absorption rate must be designed.

As an amplitude of magnetic field for magnetization of hydrogen nuclei increases, the SNR may be improved. However, if the amplitude of magnetic field becomes higher, the frequency used in an RF antenna should inevitably be increased, that is, the wavelength of field generated at the antenna should become shorter. A decrease in the wavelength (that is, an increase in frequency) in turn causes attenuation in a target subject for imaging (e.g., a man's head) due to high permittivity and conductivity of the target subject. Moreover, the problem associated with attenuation due to radiation loss also arises. Such problems are inherent in RF circuits having an operation frequency higher than 100 MHz.

Furthermore, when a radio frequency increases, the magnetic field becomes inhomogeneous, that is, the field in a man's head is distorted by phase shift. Such distortion is caused by an increase of the radio frequency and the high permittivity of a man's head. In the conventional system, which uses the magnetic field of 1 Tesla, the wavelength of the field in a man's head is about 1 m, which is much longer than the width of the head so that the phase shift may be ignored. Thus, the homogeneous magnetic field can be maintained. However, in the system that uses the magnetic field of 7 Tesla, the wavelength of the field in a man's head is about 12.5 m, which is about a half of the width of the head. Accordingly, the phase shift of the field in the head comes near 180 degree. Moreover, in the cylindrical RF antenna, which is used generally, a leg surrounding the antenna (the conductive part having the same direction as that of the main magnetic force) forms field within the antenna, and thereby the above phase shift causes a standing wave in the head so that the field in the antenna becomes convex. This convex shaped field is attributed to dielectric resonance. Due to the dielectric resonance phenomenon, the center of an image becomes bright and its peripheral part becomes dim, thus making it difficult to observe the image. That is, different image signals may possibly be obtained from the same subject, depending on the position where the image of the subject is acquired.

Another problem may also arise, which results from a penetration depth effect. The penetration depth effect means how deeply an electromagnetic wave penetrates into a subject. The penetration depth of the subject depends on the magnetic permeability, permittivity, and conductivity of the subject. When a subject with high conductivity is loaded into an antenna, the penetration depth becomes shorter. This causes a kind of damping that prevents the radio frequency from effectively contributing to form the image. That is, the homogeneous magnetic field cannot be formed.

As described above, in the high magnetic field, such as 7 Tesla, the conventional two-way (receive and transmit) antenna that has been used in the low magnetic field, such as 1 or 1.5 Tesla, cannot render an image with sufficient quality. Accordingly, the magnetic resonance imaging system, by which the above problem can be solved, is needed in the art.

SUMMARY OF THE INVENTION

The present invention provides the magnetic resonance imaging system comprising RF antennas, which can provide homogeneous magnetic field to obtain a head anatomic image with a high resolution and high signal to noise ratio (SNR)

There is a provided magnetic resonance imaging system, comprising a transmit-only antenna comprising at least two saddle quadrature antennas connected with each other to form a ring shape, one of the connections being a joint and the remaining connections being formed in an overlapping fashion, and a receive-only phased array antenna comprising a plurality of receive-only antennas connected with each other to form a ring shape, one of the connections being a joint and the remaining connections being formed in an overlapping fashion, wherein an inner diameter of the receive-only phased array antenna is shorter than that of the transmit-only antenna, and the receive-only phased array antenna is coaxially disposed inside the transmit-only antenna with a predetermined gap.

BRIEF DESCRIPTION OF THE DRAWINGS

The foregoing and other aspects and advantages are better understood from the following detailed description of a preferred embodiment of the invention with reference to the drawings, in which.

DETAILED DESCRIPTION OF THE PREFERRED EMBODIMENT

Hereinafter, an embodiment of the present invention will be described in detail with reference to the accompanying drawings. However, it should be understood that the present invention is not limited to the embodiment.

Figure 1A:
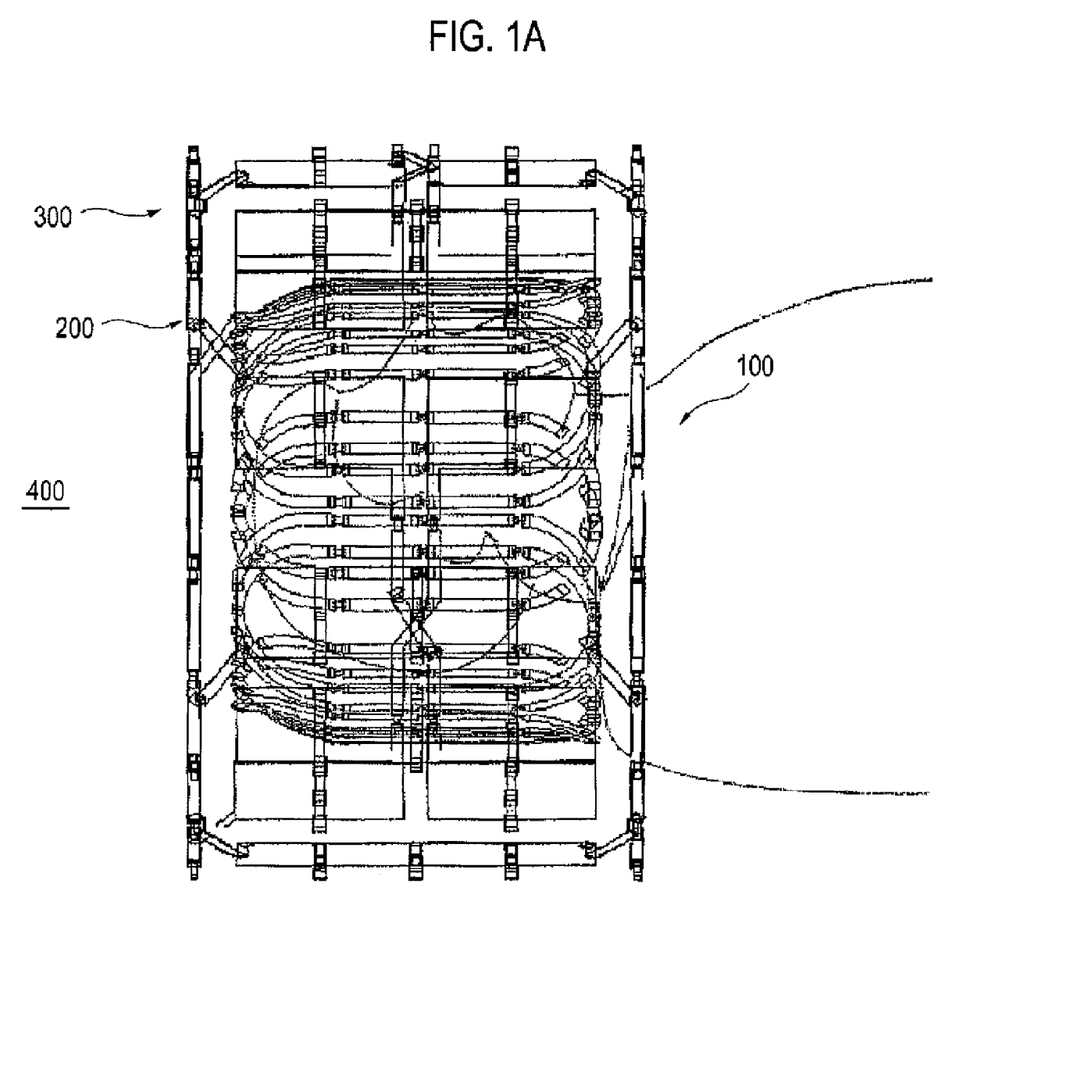
FIG. 1A is a side view of a magnetic resonance imaging system in accordance with one embodiment of the present invention.
Figure 1B:
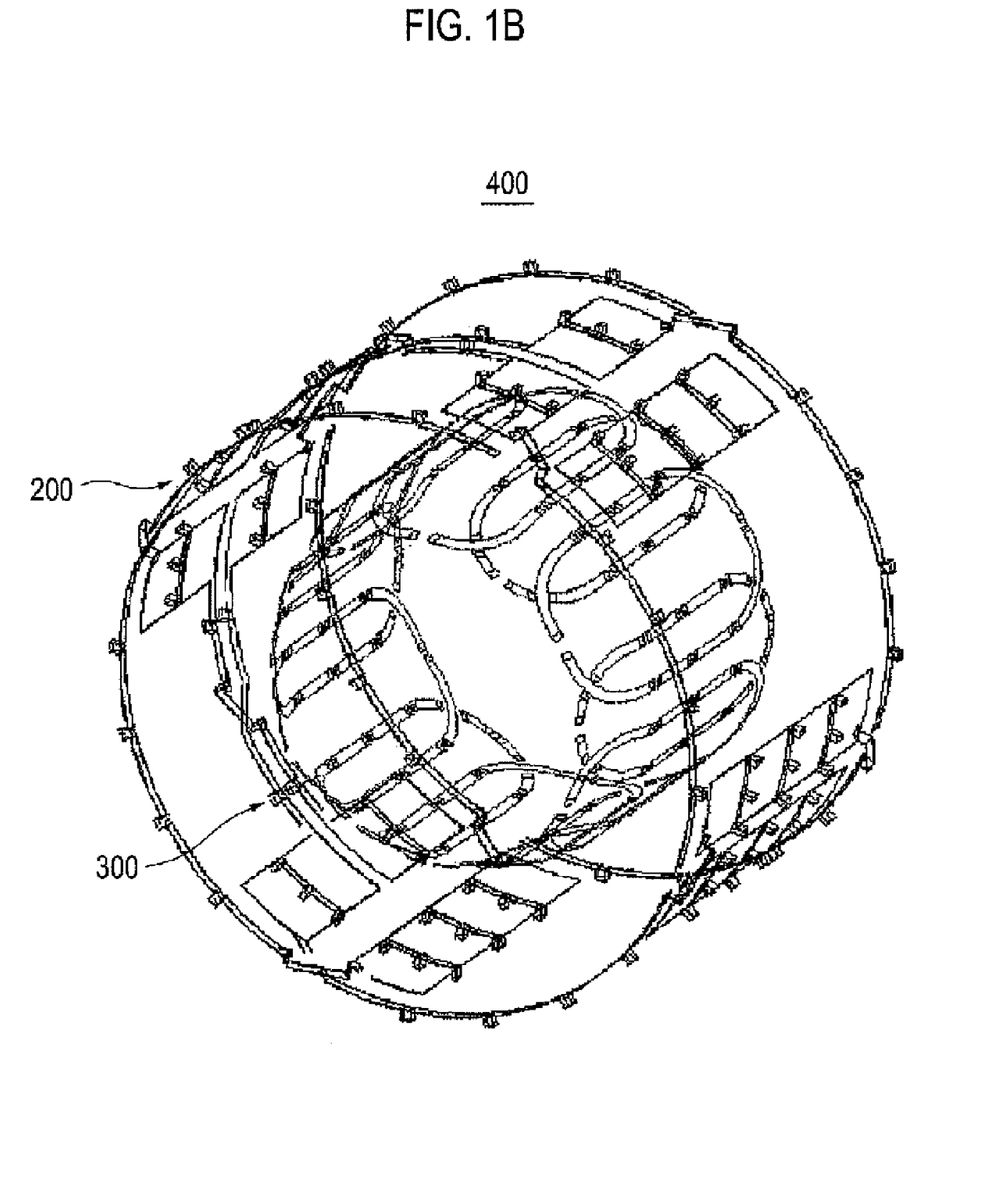
FIG. 1B is a perspective view of a magnetic resonance imaging system in accordance with one embodiment of the present invention.

FIG. 1A is a side view of a magnetic resonance system 400 in accordance with one embodiment of the present invention, and FIG. 1B is a perspective view of the system 400.

Referring to FIGS. 1A and 1B, the magnetic resonance system 400 comprises a transmit-only antenna like a quadrature coil 200 and a receive-only phased array antenna 300. The transmit-only antenna 200 may include one or more transmission antennas, and the receive-only phased array antenna 300 may include one or more receive-only antennas. As shown in FIG. 1A, when a subject 100 is loaded into the magnetic resonance imaging system 400, the inside image of the subject 100 is rendered by the signals, which are received and transmitted by the transmit-only antenna 200 and the receive-only phased array antenna 300. That is, when the transmit-only antenna 200 sends energy to protons in the subject 100, the protons of the subject 100 go into excited state, and then, after the power supplied to the transmit-only antenna 200 is shorted by using an outer switching circuit, the receive-only antenna 300 receives RF signals to render an image of the subject 100.

Figure 2:
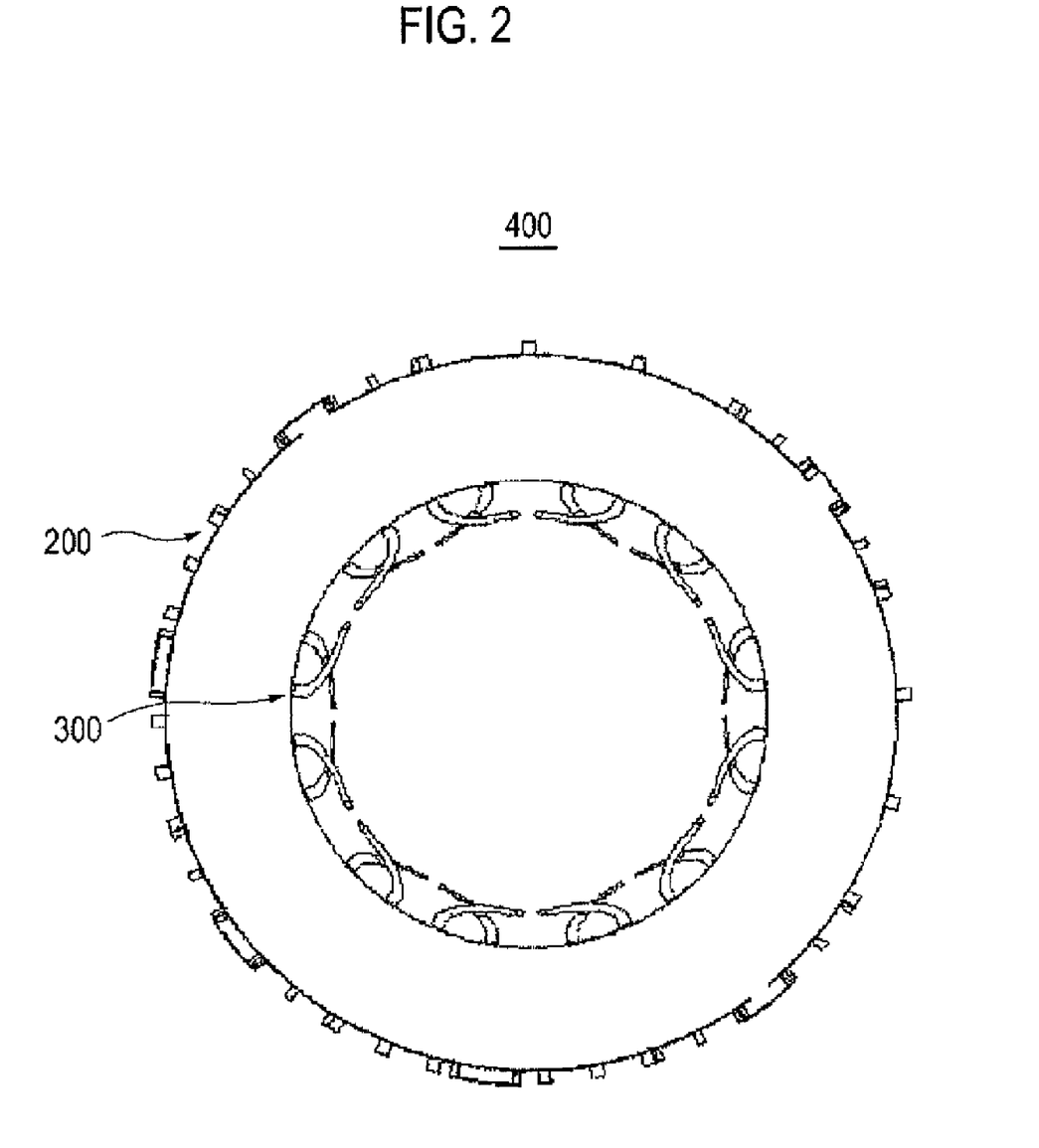
FIG. 2 is a plane view of a magnetic resonance imaging system in accordance with one embodiment of the present invention.

FIG. 2 is a plane view of a magnetic resonance imaging system 400 in accordance with one embodiment of the present invention. As shown in FIG. 2, the inner diameter of the receive-only phased array antenna 300 is shorter than that of the transmit-only antenna 200, and the receive-only phased array antenna 300 is coaxially disposed inside the transmit-only antenna 200 with the predetermined gap. The reason why the receive-only phased array antenna 300 is smaller is to obtain radio signals from the subject 100 without loss by receiving stronger signals in the position closet to the subject 100. However, when the antenna 300 becomes too small, the penetration depth becomes shorter, and thereby it is harder to form the homogeneous magnetic field. Therefore, the proper size of the antenna 300 may be the size that allows the antenna 300 to surround the subject 100 without contacting the subject 100. For example, when the average circumference of a man's head is 58 cm, the receive-only phased array antenna 300 may be longer than the average circumference.

Figure 3A:
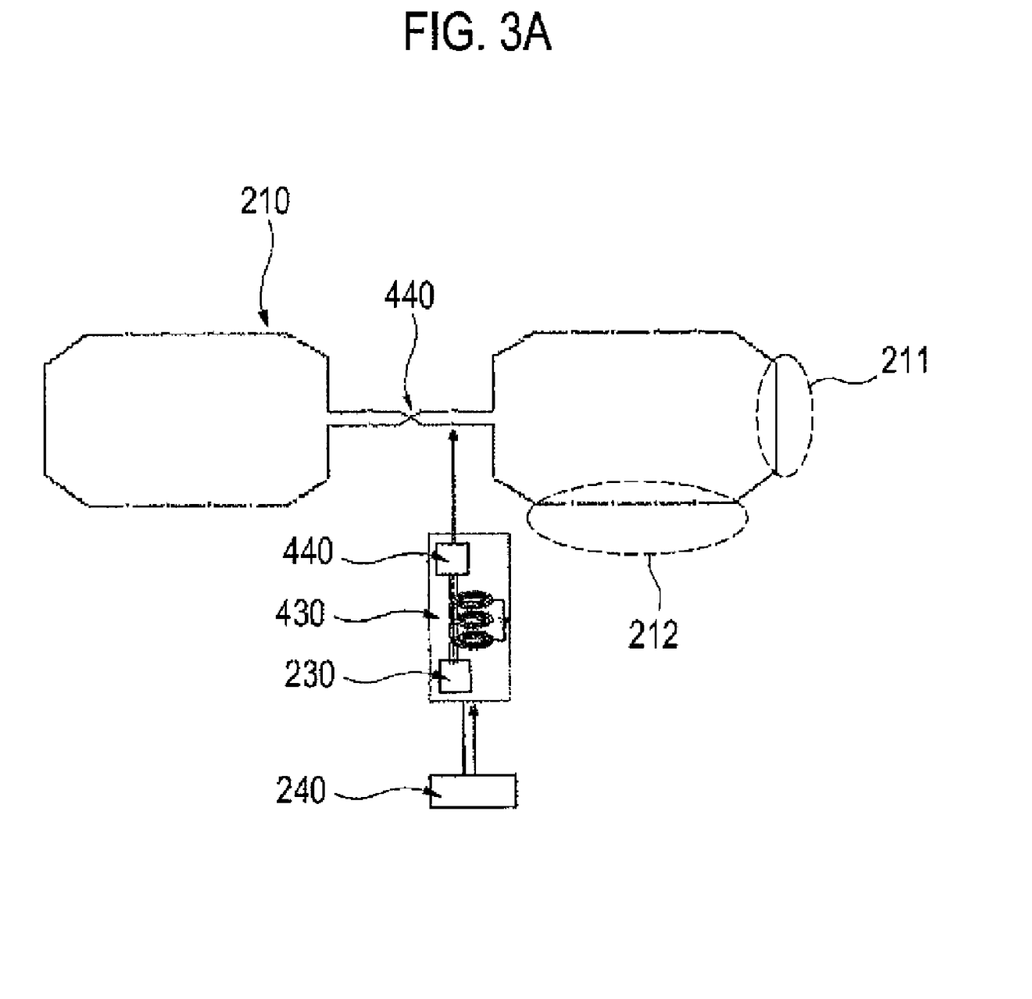
FIG. 3A illustrates a saddle quadrature antenna according to one embodiment of the present invention.
Figure 3B:
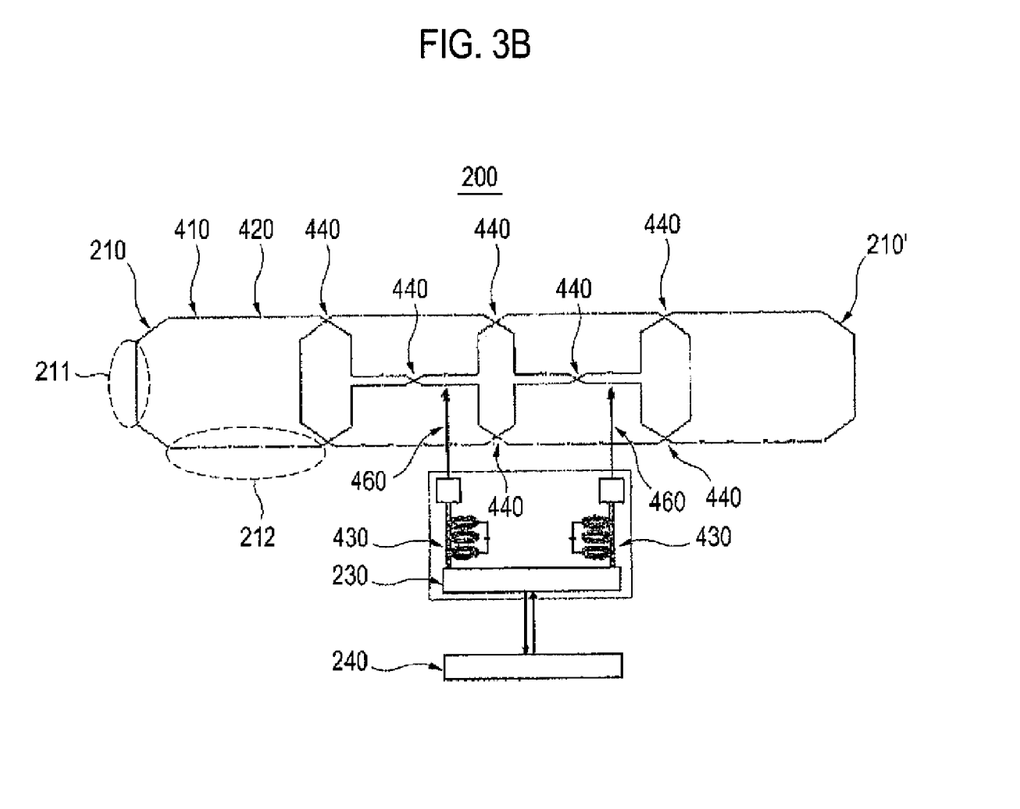
FIGS. 3B and 3C illustrate a transmit-only antenna according to one embodiment of the present invention.
Figure 3C:
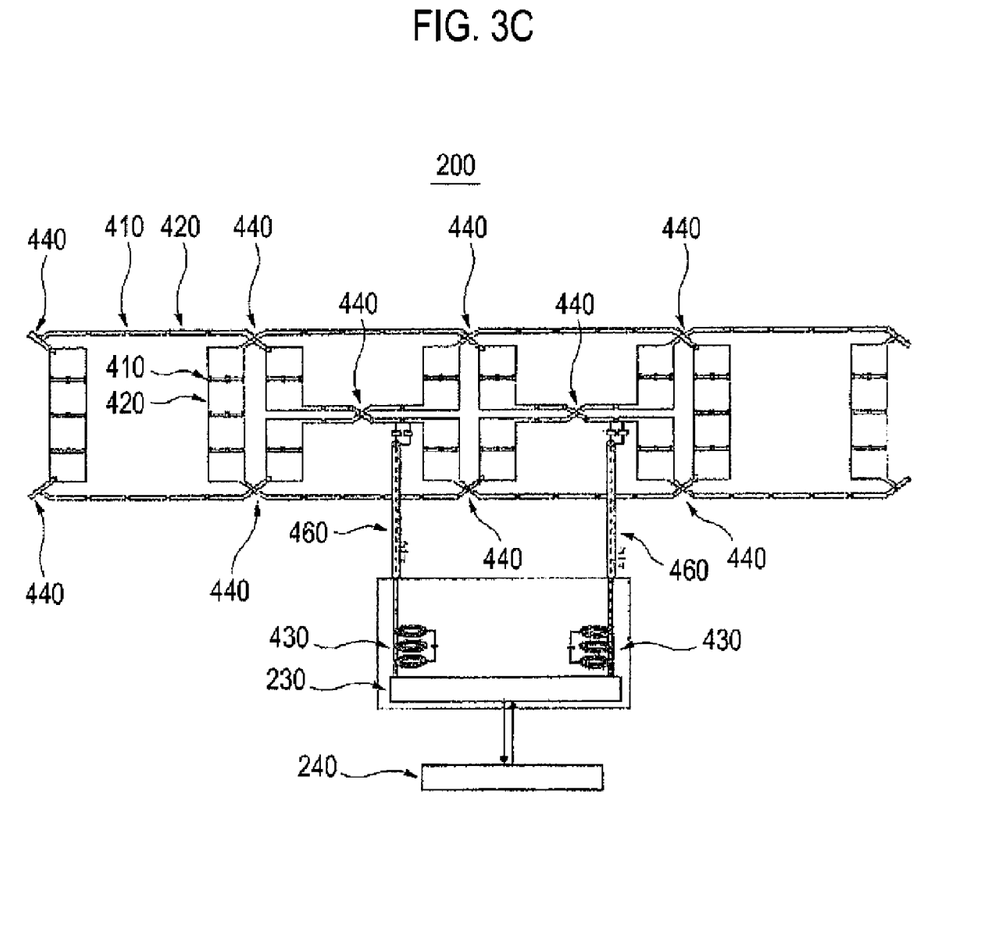

FIG. 3A illustrates a saddle quadrature antenna 200 as one embodiment of a receiving antenna, which the transmit-only antenna 200 may comprise. FIG. 3B illustrates a transmit-only antenna 200 comprising two saddle quadrature antennas 210 and 210', and FIG. 3C illustrates the transmit-only antenna 200 more particularly.

Referring to FIG. 3A, the saddle quadrature antenna 210 may comprise a rung 211, which substantially forms a magnetic field and an end-ring 212, which is the path for the flow of the electric current.

Referring to FIG. 3B, the transmit-only antenna 200 may comprise at least two saddle quadrature antennas, and the antennas may be the same as shown in FIG. 3A. For example, as shown in FIG. 3B, the two saddle quadrature antennas 210 and 210' are overlapped with each other in a predetermined portion of the antennas to have the predetermined phase difference between them. While, in only one saddle quadrature antenna, the phase difference between each rung is 60 degree to form the ideal magnetic field. FIG. 3B shows that the two saddle quadrature antennas 210 and 210' are arranged to improve the strength and homogeneity of the magnetic field.

According to one embodiment, the predetermined phase difference may be 90°, and FIG. 3B shows that the two saddle quadrature antennas 210 and 210' are overlapped so that the phase difference between them is 90°. While only one saddle quadrature antenna generates linear polarization, the two saddle quadrature antennas, which are overlapped so that the phase difference is 90°, generate a circular polarization, and thereby improve the SNR compared to the only one antenna.

Continuing to refer to FIG. 3B, a radio energy outputted from a radio-frequency amplifier 240 is transferred to an input part of a coupler 230. The coupler 230 is operable to direct radio energy outputted from the radio-frequency amplifier 240 to two ground breakers 430, and each of the two ground breakers 430 is operable to remove noise from the radio energy so that the noise-removed radio energy is transferred to a transmit-only antenna 200 through two coaxial cables 460. Then, the transmit-only antenna 200 supplies homogeneous radio energy to protons in the subject 100. According to one embodiment, the two ports (the points where the two saddle quadrature antennas 210 and 210', and the two coaxial cables 460 are connected to each other) may be positioned in the center of the transmit-only antenna 200, and more of the homogeneous magnetic field may be obtained. According to another embodiment, the two coaxial cables 460 may be disposed to be apart from the end-ring 212 to the transmit-only antenna 200 in order to remove the noise generated between the two coaxial cables 460.

According to one embodiment, the coupler 230 may be the quadrature hybrid coupler to be operable to divide and direct the radio energy outputted from the radio-frequency amplifier 240 to the two ground breakers 430, so that the radio energy at one of the two ground breakers 430 differs in phase by 90° from that at the other of the two ground breakers 430. The radio energy at the two ground breakers 430 is reduced to −3 dB, respectively, and the phases are, for example, 0 at one of the two ground breakers 430 and 90° at the other of the two ground breakers 430, so that the phase difference is 90°. Particularly, in the case that the phase difference is 90°, the two saddle quadrature antennas 210 and 210' of the transmit-only antenna 200 must be disposed so that the phase difference between them is 90° as shown in FIG. 3B. If not, an inductance coupling occurs between the antennas 210 and 210', so that the value of the transmission between the two ports becomes lower, and thereby the quality factor of the antennas becomes worse. That is, the SNR is lower and more energy of the radio-frequency amplifier is required. For example, in the 50 ohm impedance matching the transmit-only antenna 200 with the main frequency, it is hard to tune precisely. According to another embodiment, in the case that the phase difference between the two saddle quadrature antennas 210 and 210' is 90°, the radio energy outputted from the radio-frequency amplifier 240 is at the maximum when its wave length is $\lambda/4(\lambda=1\ m)$, and thus the length of each coaxial cables 460 and the ground breakers 430 may be $\lambda/4$(25 cm). Further, since the phase shift of the coaxial cables 460 and the ground breakers 430 is 180°, there is no change in the impedance.

According to one embodiment, the thickness of the rung 211, which forms the magnetic field in the transmit-only antenna 200, may be four times of that of the end-ring 212 since the end-ring 212 is just a path for the flow of the current and it cannot make the magnetic field. Further, the width of the end-ring 212 may be 1 cm. Therefore, as the width of the rung 211 is relatively large, the current distribution improves, and thereby the magnetic field distribution can also be improved.

Figure 4:
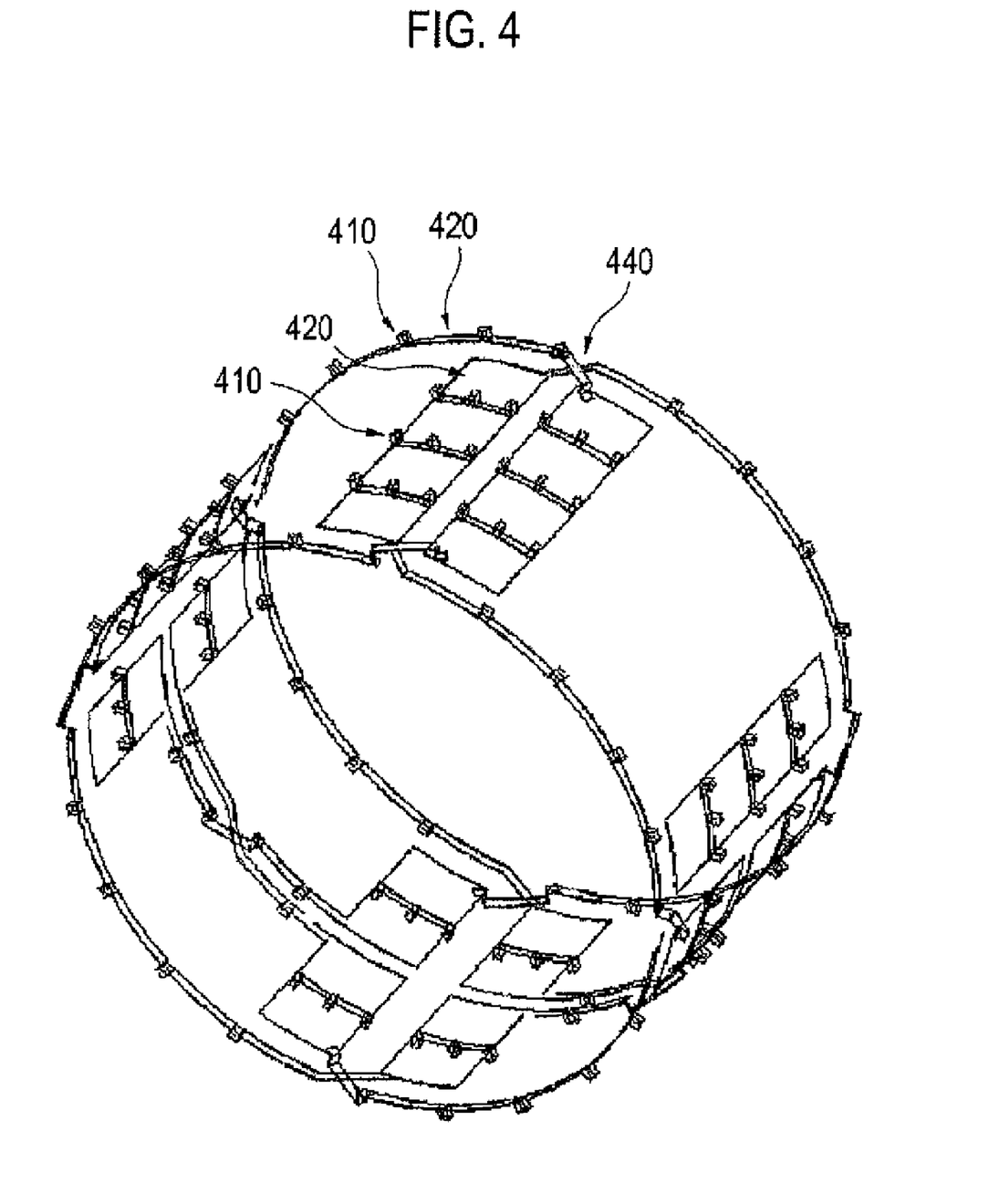
FIG. 4 is a perspective view of a transmit-only antenna in accordance with one embodiment of the present invention.

FIG. 4 is a perspective view of a transmit-only antenna 200 in accordance with one embodiment of the present invention. The ring-shaped antenna as shown in FIG. 4 is formed by connecting the both ends of the transmit-only antenna as shown in FIG. 3C.

Figure 5A:
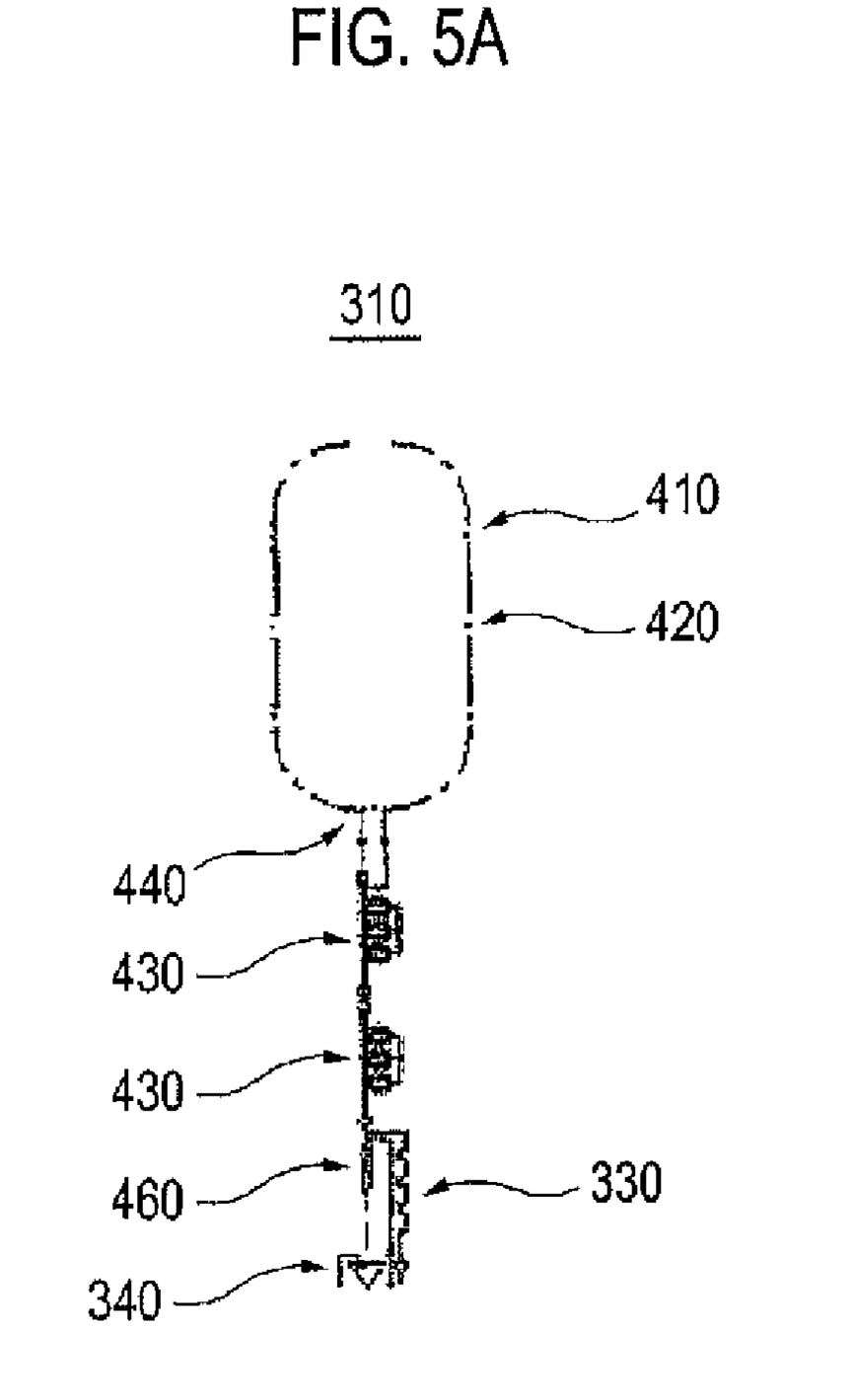
FIG. 5A illustrates a receive-only antenna according to one embodiment of the present invention.
Figure 5B:
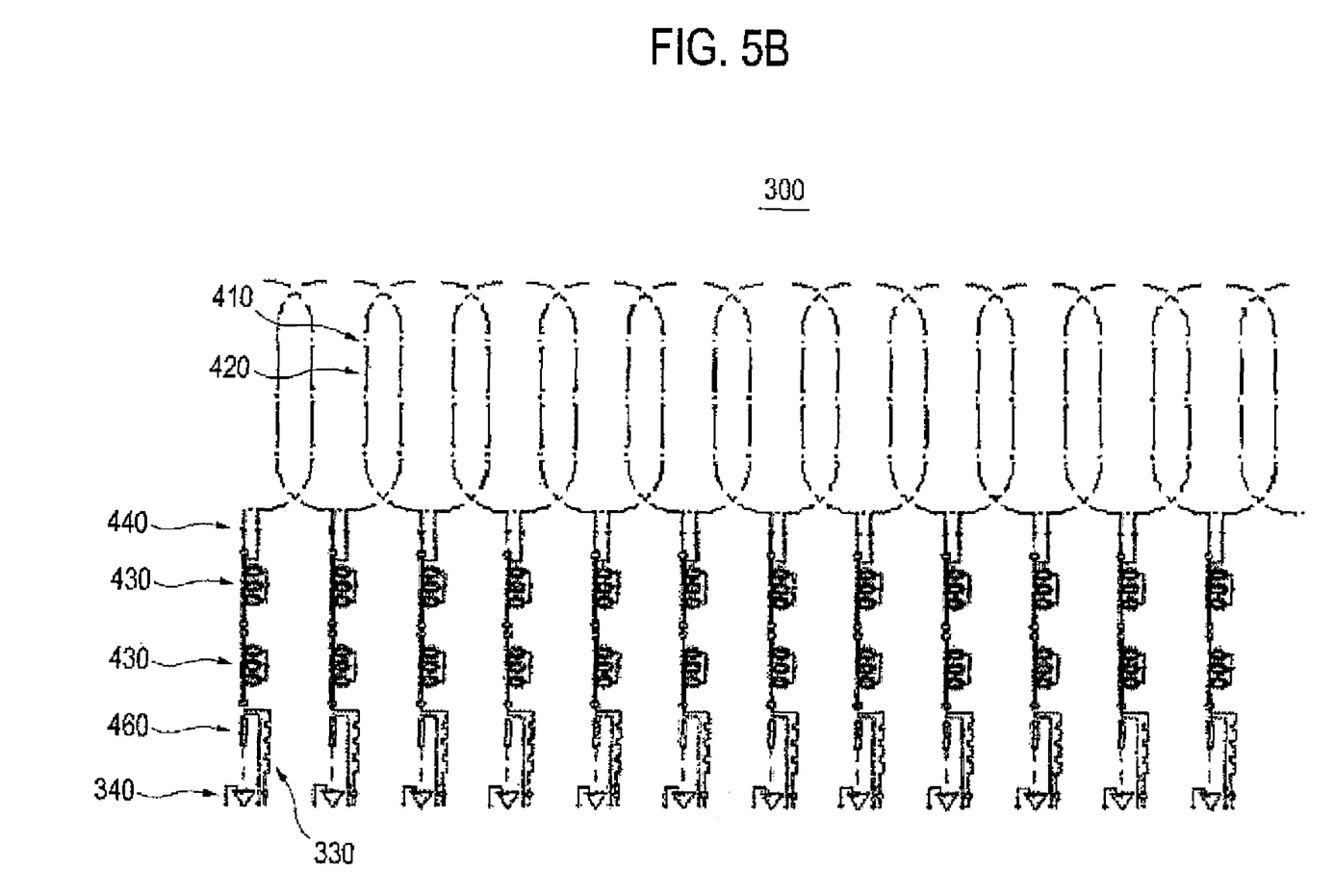
FIGS. 5B and 5C illustrates a receive-only phased array antenna according to one embodiment of the present invention.
Figure 5C:
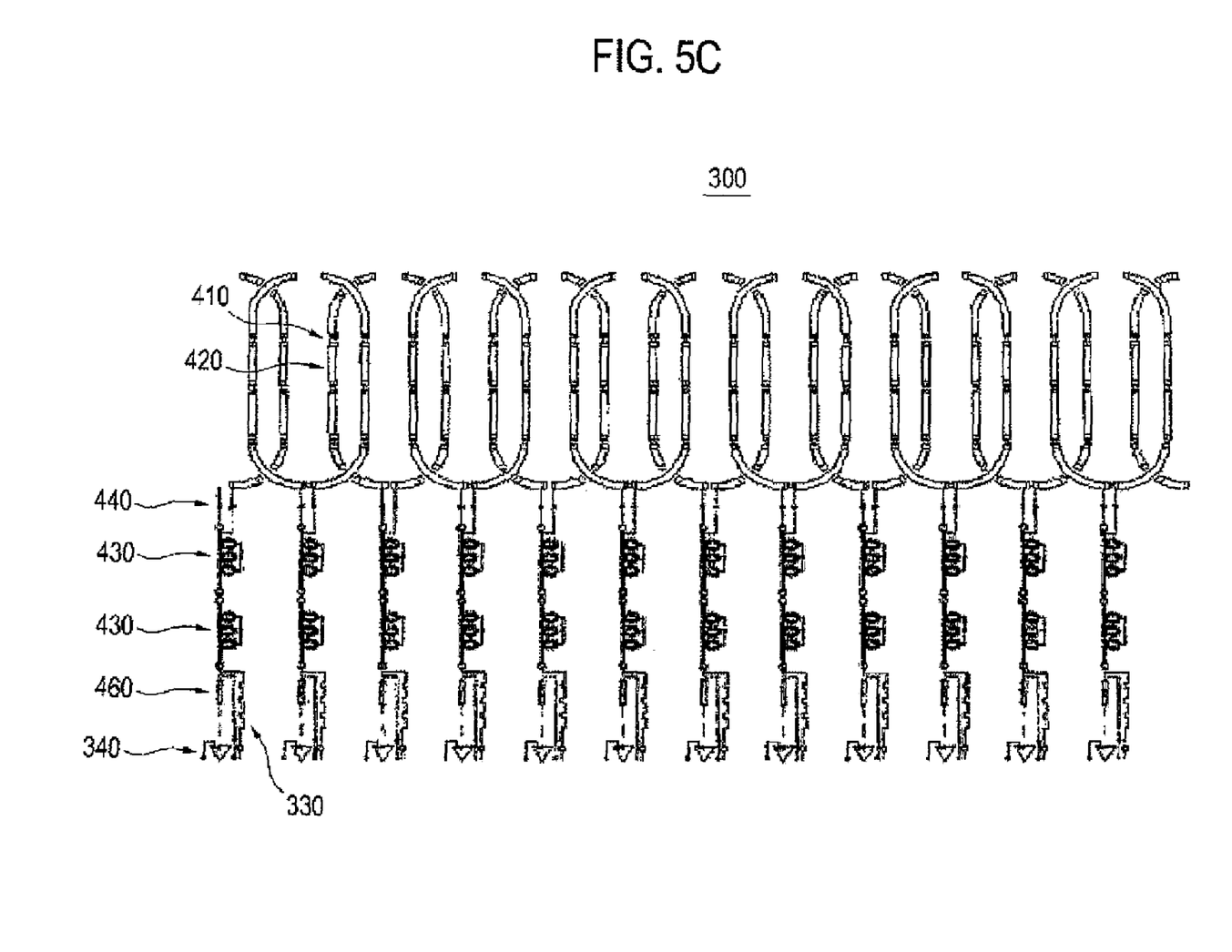

FIG. 5A illustrates a receive-only antenna 310 in accordance with one embodiment of the present invention. FIG. 5B roughly illustrates a receive-only phased array antenna 300 and FIG. 5C illustrates a receive-only phased array antenna 300 in detail.

Referring to FIG. 5B, the receive-only phased array antenna 300 comprises a plurality of the receive-only antennas 310, and thereby a homogeneous image of a subject and high SNT can be achieved. When the plurality of receive-only antennas 300 are apart from each other, the magnetic field is not formed between them. Thus, they are overlapped with each other by a proper portion of the antennas so that the homogeneous magnetic field is formed. Further, capacitors 410 having proper capacity are used in order to improve the transmission between ports where the antennas are overlapped. According to one embodiment, the receive-only phased array antenna 300 may comprise 12 receive-only antennas 310. That is, the antenna 300 may receive 12 channel signals. However, the number of the receive-only antennas 310 is not limited to this and the number may vary according to the number of required channels.

When the receive-only phased array antenna 300 is impedance-matched by an impedance matching circuit 440 with specified impedance, the antenna 300 receives all signals without reflection. According to one embodiment, the specified impedance may be 50 ohm.

According to one embodiment, the two ground breakers 430, which are linked in a line, are connected to the receive-only antennas 310, and the two ground breakers 430 is operable to remove the noise generated in the center of the receive-only antennas 310. Further, in order to transfer a radio signal, which is tens of mv, to an end point, a preamplifier 340 is operable to remove the noise of the signal partially and amplifies the signal. Moreover, the preamplifier 340 may remove mutual inductance coupling between the receive-only antennas 310 by having low input impedance According to one embodiment, the preamplifier 340 may operate by an outer DC (direct current) power source, and the preamplifier 340 may comprise a bias circuit 330.

Figure 6:
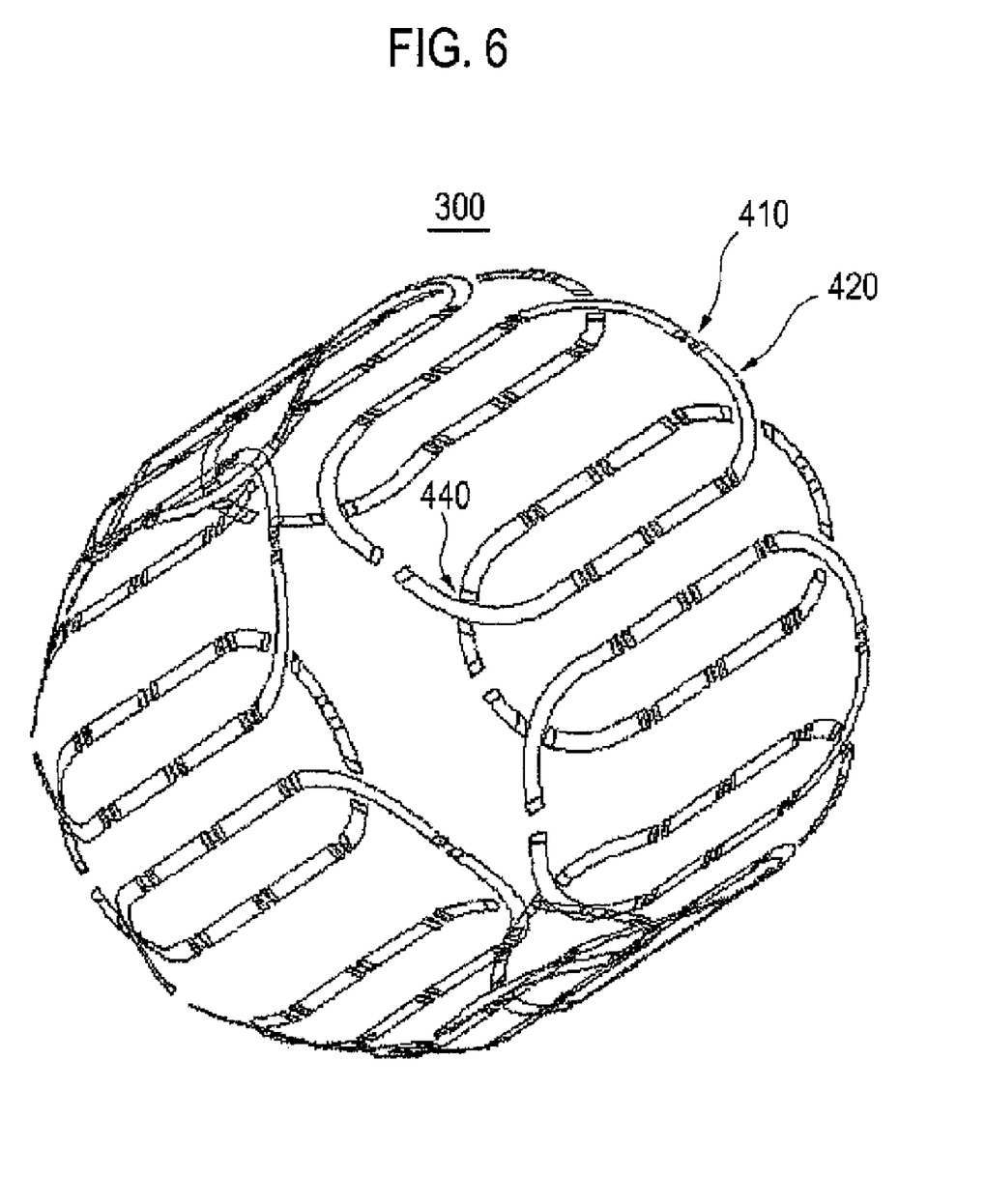
FIG. 6 is a perspective view of a receive-only phased array antenna in accordance with one embodiment of the present invention.

FIG. 6 is a perspective view of a receive-only phased array antenna 300 in accordance to one embodiment of the present invention. The ring-shaped antenna as shown in FIG. 6 is formed by connecting the both ends of the receive-only phased array antenna 300 as shown in FIG. 5C.

Meanwhile, since the transmit-only antenna 200 is disposed to be very close to the receive-only phased array antenna 300, inductors 420 of the antennas 200 and 300 may cause a strong coupling. In order to remove this coupling, a frequency detuning circuit may be added at the outside, and a capacitor, which is used in each antenna, may have the capacity for spatial segregation.

The present invention provides the homogeneous magnetic field to obtain a head anatomic image with a high resolution and high SNR by coaxially disposing a receive-only phased array antenna inside a transmit-only antenna with a predetermined gap, and thereby a detailed and accurate image of a man's head can be obtained. For example, the present invention provides a solution for the problem, which the diameter of microvessels in a man's head is too small, i.e. 0.3~0.6 mm. Thus, it is hard to render a perpendicular image of the microvessels clearly. The present invention allows an accurate image of a bunch of nerves, which are aligned from a brain stem to a backbone, and microvessels near thalamic nuclei of a brain.

The foregoing merely describes some exemplary embodiments of the present invention. One skilled in the art will readily recognize from the above descriptions, the accompanying drawings and the claims that various modifications can be made without departing from the spirit and scope of the appended claims. The above descriptions are thus to be regarded as illustrative rather than limiting.

What is claimed is:

1. A magnetic resonance imaging system comprising:
   a transmit-only antenna comprising at least two saddle quadrature antennas connected with each other to form a ring shape, one of the connections being a joint and the remaining connections being formed in an overlapping fashion; and
   a receive-only phased array antenna comprising a plurality of receive-only antennas connected with each other to form a ring shape, one of the connections being a joint and the remaining connections being formed in an overlapping fashion,
   wherein an inner diameter of the receive-only phased array antenna is shorter than that of the transmit-only antenna, and the receive-only phased array antenna is coaxially disposed inside the transmit-only antenna with a predetermined gap,
   wherein each pair of the saddle quadrature antennas are overlapped with each other so that the phase difference between said pair becomes 90°.

2. The magnetic resonance imaging system of claim 1, further comprising:
   a radio-frequency amplifier;
   a coupler connected to the radio-frequency amplifier;
   two ground breakers connected to the coupler; and
   two coaxial cables each being connected to each of the ground breakers and a respective one of the saddle quadrature antennas,
   wherein the coupler is operable to direct radio energy outputted from the radio-frequency amplifier to the two ground breakers,
   wherein each of the two ground breakers is operable to remove noise from the radio energy so that the noise-removed radio energy is transferred to the saddle quadrature antennas through the two coaxial cables.

3. The magnetic resonance imaging system of claim 2, wherein the coupler is operable to divide and direct the radio energy outputted from the radio-frequency amplifier to the two ground breakers, so that the radio energy at one of the two ground breakers differs in phase by 90° from that at the other of the two ground breakers.

4. The magnetic resonance imaging system of claim 2, wherein a length of each of the two ground breakers and the two coaxial cables is 25 cm.

5. The magnetic resonance imaging system of claim 1, the number of the plurality of receive-only antennas is 12.

6. The magnetic resonance imaging system of claim 1, further comprising:
   a plurality of impedance matching circuits, each being connected to a respective one of the plurality of receive-only antennas;
   a plurality of ground breakers, each being connected to a respective one of the plurality of impedance matching circuits; and
   a plurality of preamplifiers, each being connected to a respective one of the plurality of ground breakers, wherein each of the plurality of ground breakers removes noise from signals provided from the respective one of the plurality of receive-only antennas, and each of the plurality of preamplifiers is operable to amplify the noise-removed signals.

7. A magnetic resonance imaging system comprising:

a transmit-only antenna having a ring shape and comprising at least two transmitting antennas; and a receive-only phased array antenna having a ring shape and comprising a plurality of receive-only antennas, wherein an inner diameter of the receive-only phased array antenna is shorter than that of the transmit-only antenna, and the receive-only phased array antenna is coaxially disposed inside the transmit-only antenna with a predetermined gap, wherein each pair of the transmitting antennas are overlapped with each other so that the phase difference between said pair becomes 90°.

8. The magnetic resonance imaging system of claim 7, wherein the receive-only phased array antenna comprises 12 receive-only antennas.

* * * * *